United States Patent [19]

Makinouchi

[11] Patent Number: 5,742,376
[45] Date of Patent: Apr. 21, 1998

[54] PROJECTION EXPOSURE APPARATUS AND PROJECTION EXPOSURE METHOD

[75] Inventor: Susumu Makinouchi, Zama, Japan

[73] Assignee: Nikon Corporation, Tokyo, Japan

[21] Appl. No.: 757,095

[22] Filed: Dec. 2, 1996

Related U.S. Application Data

[63] Continuation of Ser. No. 234,357, Apr. 28, 1994, abandoned.

[30] Foreign Application Priority Data

Apr. 28, 1993 [JP] Japan .................. 5-103086

[51] Int. Cl.$^6$ .................................. G03B 27/52
[52] U.S. Cl. .................. 355/53; 355/50; 355/67; 355/71; 430/5
[58] Field of Search ................. 355/50, 53, 67, 355/71; 430/5, 397

[56] References Cited

U.S. PATENT DOCUMENTS

| | | | |
|---|---|---|---|
| 4,869,999 | 9/1989 | Fukuda et al. | 430/311 |
| 4,992,825 | 2/1991 | Fukuda et al. | 355/53 |
| 5,008,205 | 4/1991 | Sindledecker | 355/43 |
| 5,117,254 | 5/1992 | Kawashima et al. | 355/43 |
| 5,194,893 | 3/1993 | Nishi | 355/53 |
| 5,255,050 | 10/1993 | Kitagawa | 355/53 |
| 5,285,236 | 2/1994 | Jain | 355/53 |
| 5,291,240 | 3/1994 | Jain | 355/53 |
| 5,331,369 | 7/1994 | Terasawa et al. | 355/53 |

Primary Examiner—Daniel P. Malley
Attorney, Agent, or Firm—Shapiro and Shapiro

[57] ABSTRACT

A projection exposure apparatus has an illumination optical system for directing exposure light to an illumination area with a predetermined shape on a mask with a pattern for transfer; a projection optical system for projecting an image of the pattern within the illumination area of the mask to a photosensitive substrate; a mask stage for scanning the mask in a predetermined scan direction with respect to the illumination area; and a substrate stage for scanning the photosensitive substrate in a direction corresponding to the scan direction in synchronism with the scanning of the mask. The relative positions of an image plane of the projection optical system and an exposure surface of the photosensitive substrate are changeable in the direction of the axis of the projection optical system and changed in a predetermined cycle when performing the scanning while projecting the image of the pattern of the mask to the photosensitive substrate.

20 Claims, 4 Drawing Sheets

PROJECTION EXPOSURE APPARATUS AND PROJECTION EXPOSURE METHOD

This is a continuation of application Ser. No. 08/234,357 filed Apr. 28, 1994, now abandoned.

BACKGROUND OF THE INVENTION

1. Field of the Invention

The present invention relates to a slit scan type projection exposure apparatus and a projection exposure method wherein a pattern of a mask is exposed on a photosensitive substrate by illuminating a rectangular or a circular illumination area with exposure light from a pulsed light source or a continuous emission type light source and scanning the mask and the photosensitive substrate synchronously with respect to the illumination area.

2. Related Background Art

Conventionally, a projection exposure apparatus is used to expose a pattern of a photomask or a reticle (hereinafter called a reticle) on a substrate with a photoresist applied thereto such as a wafer, a glass plate or the like via a projection optical system when manufacturing a semiconductor device, a liquid crystal display device, a thin film magnetic head, or the like by use of a photolithography technique. As the high integration of semiconductor devices or the like progresses, it is required to improve the resolution of a pattern to be projected to a substrate in such a projection exposure apparatus. Generally, when the wavelength of exposure light is $\lambda$, the numerical aperture of a projection optical system is NA and a process constant is $K_1$, the resolution of the projection optical system is expressed by $K_1 \cdot \lambda / NA$. Then, in order to improve the resolution, it is considered that the numerical aperture is enlarged.

However, as the depth of focus of the projection optical system is expressed by $K_2 \cdot \lambda / NA^2$ ($K_2$ is a coefficient), the depth of focus becomes too shallow when the numerical aperture is enlarged. In connection with this, when a pattern to be exposed is a grating-like pattern with a constant pitch like a circuit section of a memory, it is known that the depth of focus as well as the resolution can be improved by an illumination deforming method wherein principal rays of an exposure light from an illumination optical system are inclined. Furthermore, in a projection exposure apparatus for exposing a pattern image of a reticle on each shot area on a substrate, as a method for enlarging the apparent depth of focus in exposing an isolated pattern such as a contact hole, there is a FLEX (Focus Latitude Enhancement Exposure) method wherein an exposure to a shot area on the substrate is divided into a plurality of exposures and the substrate is moved intermittently by a predetermined amount in the direction of the optical axis of the projection optical system for each exposure to perform multiple exposures. The FLEX method is disclosed in, e.g., U.S. Pat. Nos. 4,869,999 and 4,992,825.

In the FLEX method, there is a system as disclosed in U.S. Ser. No. 820,244 (Jan. 14, 1992) wherein multiple exposures are performed by not changing the focus position intermittently but changing it continuously.

Recently, there is a tendency that a chip pattern such as of a semiconductor device becomes large. Then, in the projection exposure apparatus, it is required to expose a large pattern of a reticle on a substrate. Also, as a pattern of a semiconductor or the like becomes minute, improvement of the resolution of the projection optical system is required. However, there is a problem that from the view point of the design and the manufacture, it is difficult to enlarge the exposure field of the projection optical system to improve the resolution. Especially, when the reflective and refractive system is utilized as the projection optical system, the exposure field with no aberration happens to be a circular area.

To cope with the large pattern and the limitation of the exposure field of the projection optical system, a slit scan type projection exposure apparatus has been proposed wherein a pattern on a reticle is exposed on a substrate by scanning the reticle and the substrate synchronously with respect to, e.g., a rectangular, circular or hexagonal illumination area. Also, in the slit scan type projection exposure apparatus, it is required to improve the resolution without reducing the depth of focus.

Therefore, if the FLEX method is applied to the slit scan type projection exposure apparatus, it is necessary to perform scan exposures several times with the focus position of the substrate changed. However, it is inconvenient to perform several scan exposures since the exposure time is increased and the throughput of the exposure process is lowered.

SUMMARY OF THE INVENTION

It is an object of the present invention to provide a projection exposure apparatus and a projection exposure method capable of substantially increasing the depth of focus without lengthening an exposure time.

A projection exposure apparatus of the present invention has an illumination optical system for directing exposure light to an illumination area having a predetermined shape on a mask with a pattern to be transferred; a mask stage for scanning the mask in a predetermined scan direction with respect to the illumination area; a substrate stage for scanning a photosensitive substrate in a direction corresponding to the scan direction in synchronism with the scanning of the mask; and a relative changing means that changes relative positions of an image plane of the projection optical system and the exposure surface of the photosensitive substrate in the direction of the optical axis of the projection optical system, and exposes the image of the pattern of the mask on the photosensitive substrate successively. Further, the apparatus has control means. When scanning the mask and the substrate synchronously while projecting the image of the pattern of the mask to the photosensitive substrate, the control means cyclically shifts, via the relative changing means, the image plane of the projection optical system and the exposure surface of the photosensitive substrate relatively in a sine-wave-like manner or a step-like manner. The shift cycle is twice as great, or 1/n times as great, (n is an integer equal to or more than 1) as the time when the substrate stage is moved in its scan direction a distance equivalent to the width of an area on the photosensitive substrate in the scan direction of the substrate stage the, area on the photosensitive substrate corresponding to the illumination area.

Also, a projection exposure method of the present invention comprises positioning a mask with a pattern for transfer on a mask stage; emitting exposure light to an illumination area with a predetermined shape on the mask; projecting an image of the pattern within the illumination area of the mask to the photosensitive substrate on the substrate stage via a projection optical system; scanning the mask in a predetermined scan direction with respect to the illumination area; scanning the photosensitive substrate in a direction corresponding to the scan direction in synchronism with the scanning of the mask; and changing relative positions of an image plane of the projection optical system and an exposure surface of the photosensitive substrate in the direction of the axis of the projection optical system in a predetermined cycle when performing the scanning while projecting the image of the pattern of the mask to the photosensitive substrate.

Further, when scanning the mask and the photosensitive substrate synchronously while projecting the image of the pattern of the mask to the photosensitive substrate, the image plane surface of the projection optical system and the exposure surface of the photosensitive substrate are cyclically shifted relatively in a sine-wave-like manner or a step-like manner. The shift cycle is twice as great or 1/n times as great (n is an integer equal to or more than 1) as the time when the substrate stage is moved in its scan direction by a distance equal to the width of an area on the photosensitive substrate in the scan direction of the substrate stage, the area on the photosensitive substrate corresponding to the illumination area.

According to the present invention, when performing an exposure by the slit scan exposure system, the exposure surface of the photosensitive substrate is moved relatively and periodically in the direction of the optical axis of the projection optical system with respect to the image plane of the projection optical system. Also, the cycle $T_n$ of the relative movement is twice, or 1/n times, as great as the time $T_0$ when a certain exposure point on the photosensitive substrate scans over the width D of a slit-like exposure area on the photosensitive substrate. Accordingly, when the cycle $T_n$ is, e.g., 1/n of the time $T_0$ and the image forming surface of the projection optical system is located in the focus position $(Z_0)$ and when the exposure point is oscillated cyclically between the focus position $(Z_0+b)$ and the focus position $(Z_0-b)$ relative to the image surface during the cycle $T_0$, any exposure point on the photosensitive substrate is oscillated n times between the focus positions $(Z_0+b)$ and $(Z_0-b)$ while any exposure point is scanned relatively to the exposure area. Also, even if the cycle $T_n$ is twice the time $T_0$, any exposure point on the photosensitive substrate maybe moved between the focus positions $(Z_0+b)$ and $(Z_0-b)$ while any exposure point is scanned relatively to the expo sure area.

Therefore, in any exposure point on the substrate, the relationship between the focus positions and the exposure energies shows that the exposure energies in the focus positions $(Z_0+b)$ and $(Z_0-b)$ are enlarged or the exposure energies are approximately uniform between the focus positions $(Z_0+b)$ and $(Z_0-b)$. Consequently, it is possible to obtain the distribution of the exposure energies the same as in the conventional FLEX method, whereby the depth of focus in the entire surface of the substrate is substantially increased.

That is, as the image plane of the projection optical system and the exposure surface of the photosensitive substrate are shifted relatively and periodically when performing the exposure by the slit scan exposure system, exposure amounts in a plurality of different positions with respect to the image plane of the projection optical system can be enlarged in any exposure point on the substrate during one exposure. As a result, the depth of focus can be substantially increased without lowering the throughput.

Furthermore, in order to effect the above-mentioned relative movement, there are a method wherein the image plane of the projection optical system is fixed and the exposure surface of the photosensitive substrate is shifted, a method wherein the exposure surface of the photosensitive substrate is fixed and the image plane of the projection optical system is shifted and a method wherein the image plane of the projection optical system and the exposure surface of the photosensitive substrate are simultaneously shifted. In any of these methods, the depth of focus can be increased.

DETAILED DESCRIPTION OF THE PREFERRED EMBODIMENTS

An embodiment of the present invention will be described with reference to the accompanying drawings. In this embodiment, the present invention is applied to a slit scan type projection exposure apparatus with a pulse oscillation type exposure light source such as an excimer laser light source.

Figure 1:
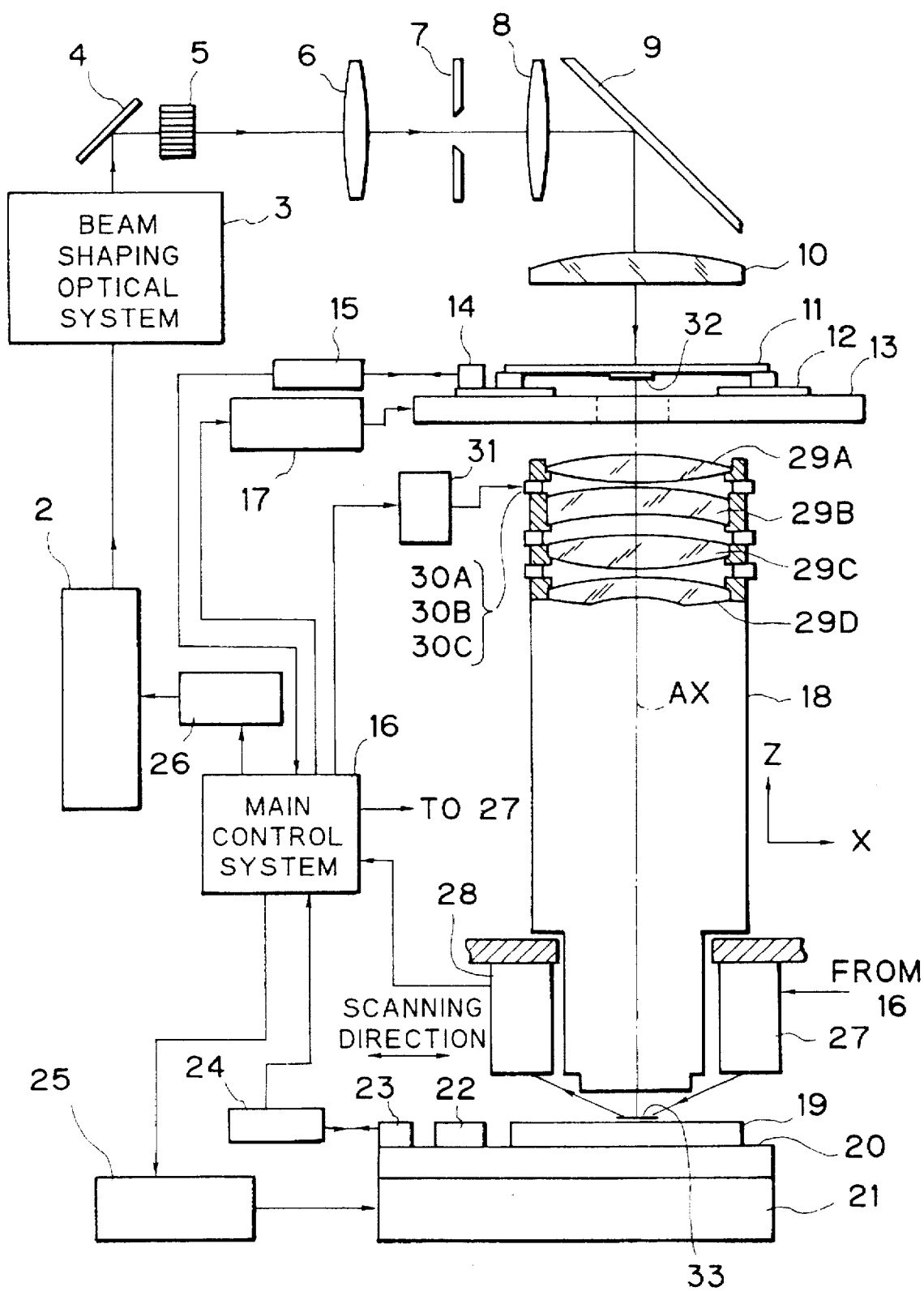
FIG. 1 shows a projection exposure apparatus according to an embodiment of the present invention.

FIG. 1 shows the structure of the projection exposure apparatus. In FIG. 1, pulsed laser light is emitted from a pulse oscillation type light source 2 such as an excimer laser light source to a beam shaping optical system 3 constituted of cylindrical lenses or a beam expander or the like. The shape of the cross section of the pulsed laser light is changed by the beam shaping optical system 3 such that the pulsed laser light is incident on the following fly eye lens 5 efficiently. The pulsed laser light emitted from the beam shaping optical system 3 is incident on the fly eye lens 5 via a mirror 4.

The laser light emitted from the fly eye lens 5 illuminates a field stop 7 with uniform luminous intensity by means of a first relay lens 6. The opening portion of the field stop 7 is in the shape of a rectangle. The laser light passed through the field stop 7 illuminates a reticle 11 on a reticle stage 12 with uniform luminous intensity via a second relay lens 8, a bending mirror 9 and a main condenser lens 10. The field stop 7 is conjugate with a pattern formed on a surface of the reticle 11 and the laser light illuminates a rectangular and slit-like illumination area 32 on the reticle 11 which is conjugate with the opening portion of the field stop 7. The Z-coordinate axis is defined as being parallel with the optical axis of a projection optical system 18 to be described later in detail. The scan direction of the reticle 11 in a plane perpendicular to the optical axis of the projection optical system 18 with respect to the illumination area 32 is made to be an X direction (or -X direction). The X direction is the lateral direction of the paper of FIG. 1.

Reticle stage 12 is supported by a reticle supporting plate 13 so as to be slidable along the X direction. A movable mirror 14 is fixed on an end portion of the reticle stage 12 in the X direction. A beam from a laser interferometer 15 is reflected by the movable mirror 14 thereby to monitor the X-coordinate of the reticle stage 12 constantly. The X-coordinate measured by the laser interferometer 15 is supplied to a main control system 16, which then controls the movement of the reticle stage 12 in the X direction via a reticle stage controller 17. The main control system 16 controls the entire operation of the apparatus.

A pattern image within the slit-like illumination area 32 on the reticle 11 is projected and exposed on an exposure area 33 on a wafer 19 via the projection optical system 18. A photoresist is applied to the wafer 19. The wafer 19 is disposed via a Z stage 20 on an XY stage 21 movable at least in the X direction. The Z stage 20 moves the wafer 19 in the Z direction parallel to the optical axis of the projection optical system 18. When performing exposures by the slit scan exposure method, the wafer 19 is scanned in the $-X$ direction (or X direction) by means of the XY stage 21 in synchronism with the scanning of the reticle 11 in the X direction (or the $-X$ direction) by means of the reticle stage 12. If the magnification of the projection optical system 18 from the reticle 11 to the wafer 19 is $\beta_0$ ($\beta_0$ is, e.g., $\frac{1}{5}$, $\frac{1}{4}$, etc.), the wafer 19 is scanned in the $-X$ direction at a speed V in synchronism with the scanning of the reticle 11 in the X direction at a speed $V/\beta_0$.

A movable mirror 23 and a reference mark member 22 formed with various reference marks for alignment are fixed on the Z stage 20. A beam from a laser interferometer 24 is reflected by the movable mirror 23 thereby to constantly monitor coordinates of the XY stage 21 in the X direction and the Y direction perpendicular to the X direction by means of the laser interferometer 24. The measured two-dimensional coordinates are supplied to the main control system 16, which then controls the movements of the XY stage 21 in the X and Y directions via a wafer stage controller 25. Further, the main control system 16 controls the oscillation timing and the oscillation frequency of the light source 2 via a trigger controller 26 and controls the amount of each pulse of pulsed laser light from the light source 2 via a light source controller (not shown).

Also, on sides of the projection optical system 18 is disposed an autofocus sensor (hereinafter referred to as the AF sensor) for detecting the height (focus position) of the exposure surface of the wafer 19 in the Z direction. The AF sensor is constituted of a light emitting system 27 and a light receiving system 28. The light emitting system 27 forms a slit pattern image on the exposure surface of the wafer 19 obliquely with respect to the optical axis AX. Detecting light emitted from the light emitting system 27 to the wafer 19 is, e.g., of a wavelength band having low photosensitivity to the photoresist on the wafer 19 or of a comparatively wide wavelength band where thin film interference on the photoresist is hard to occur. After being emitted from the light emitting system 27 and reflected by the exposure surface of the wafer 19, the detecting light forms a slit pattern image again on a photoelectric detecting device with a slit-like light receiving surface via an oscillating mirror and an image forming optical system within the light receiving system 28.

A photoelectric conversion signal of the photoelectric detecting device is rectified synchronously by a drive signal of the oscillating mirror in the light receiving system 28 to obtain a focus signal, which is supplied to the main control system 16. In this case, when the exposure surface of the wafer 19 is moved in the Z direction, the slit pattern image on the exposure surface is moved in the X direction. Accordingly, the slit pattern image formed on the light receiving surface of the photoelectric detecting device in the light receiving system 28 is moved laterally, whereby the value of the focus signal is changed. Also, a focus position (best focus position) when the exposure surface of a wafer 19 employed for measurement is located at the image plane of the projection optical system 18 is measured by test prints. And, calibration is performed such that the value of the focus signal becomes a predetermined value (e.g., 0) when the exposure surface of the wafer 19 employed for measurement is set in the best focus position.

Thereby, the main control system 16 can check the deviation between the focus position of the exposure surface of the wafer 19 and the best focus position (the position of the image plane). When performing exposures by the slit scan exposure method, the main control system 16 shifts the focus position of the exposure surface of the wafer 19 periodically in a step-like manner or a sine-wave-like manner. Further, a plurality of slit pattern images may be projected with respect to the exposure surface of the wafer 19 from the light emitting system 27 of the AF sensor and the focus position at a plurality of measuring points of the exposure surface of the wafer 19 may be measured simultaneously.

Also, instead of shifting the exposure surface of the wafer 19 with respect to the image plane of the projection optical system 18, the position of the exposure surface of the wafer 19 may be fixed in the Z direction and the image plane of the projection optical system 18 itself may be shifted. Therefore, in this embodiment, the apparatus is provided with a mechanism for shifting the position of the image plane of the projection optical system 18 in the Z direction. Specifically, the projection optical system 18 is constituted of lenses 29A, 29B and 29C in the order from the side of the reticle 11. Three actuators 30A, 30B and 30C consisting of respective piezo-electric devices are provided between the lens 29A closest to the reticle 11 and the lens 29B. A driver 31 changes the thicknesses of the actuators 30A, 30B and 30C in accordance with instructions of the main control system 16 to change the distance between the lenses 29A and 29B, whereby the position of the image plane of the projection optical system 18 is adjusted in the Z direction within a predetermined range.

Instead of changing the distance of the lenses by means of the actuators, the position of the image plane of the projection optical system 18 may be adjusted by changing the wavelength of the exposure light and utilizing the color aberration of the projection optical system.

Also, the position of the image plane of the projection optical system 18 can be changed by shifting the reticle 11 in the direction of the optical axis AX. Then, if a reticle lifting mechanism for changing the position of the reticle 11 in the direction of the optical axis AX is provided, the relative positional relationship between the image plane of the projection optical system 18 and the exposure surface of the wafer 19 in the Z direction can be changed. Although the focus position of the exposure surface of the wafer 19 is shifted periodically via the Z stage 20 below, the image plane of the projection optical system 18 may be shifted with respect to the exposure surface of the wafer 19 periodically by shifting the lens 29A or raising or lowering the reticle 11 as above.

Next, an example of the operation for exposing the pattern of the reticle 11 on the wafer 19 continuously by the slit scan exposure method in the projection exposure apparatus of this embodiment will be described. First, the wafer 19 to be exposed is disposed on the Z stage 20 and the alignment of the reticle 11 and the wafer 19 is performed. Thereafter, in synchronism with the scanning of the reticle 11 in the $-X$ direction at the speed $V/\beta_0$ with respect to the slit-like illumination area 32 via the reticle stage 12, the wafer 19 is scanned in the X direction at the speed V with respect to the slit-like exposure area 33 conjugate with the illumination area 32 via the XY stage 21.

Figure 2A:
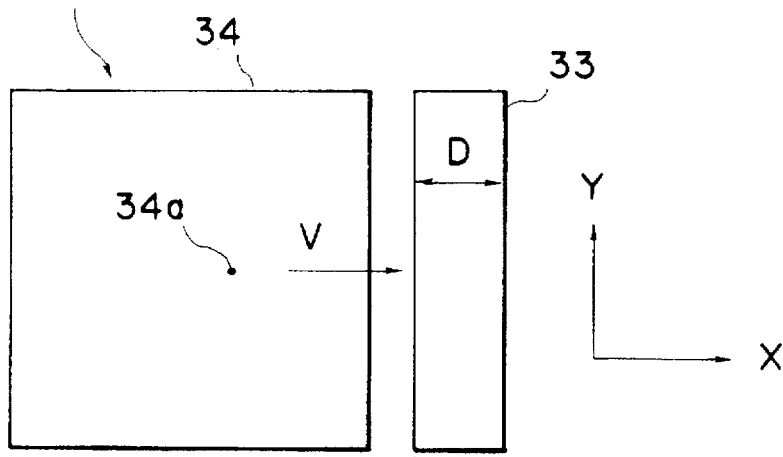
FIG. 2A is a plan view showing a slit-like exposure area and a shot area on a wafer.
Figure 2B:
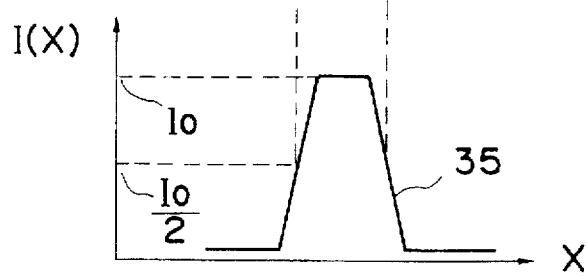
FIG. 2B shows the luminous intensity distribution of the exposure area in a scan direction.

FIG. 2A shows a portion of the exposure surface of the wafer 19. In FIG. 2A, a shot area 34 on the wafer 19 is scanned in the X direction at the speed V with respect to the slit-like exposure area 33. The width of the exposure area 33 in the scan direction (X direction) is made to be D. Also, in FIG. 2B, a distribution curve 35 shows the luminous intensity distribution I (X) of the exposure area 33 in the X direction. The luminous intensity distribution I is in the shape of a trapezoid and the maximum value thereof is $I_0$. The distance between points at lateral ends of the luminous intensity distribution $I_0$ (X) in the X direction wherein the luminous intensity becomes $I_0/2$ is equivalent to the width D.

The light source 2 is the pulse emitting type and the cycle of emitting pulsed laser light is, e.g., $1/m$ (m is an integer equal to or more than the minimum integer number $N_{min}$) of the time $T_0$ when the wafer 19 is moved by the width D in the scan direction (X direction). The integer $N_{min}$ is defined as the minimum number of pulses by which desired uniformity of luminous intensity can be obtained when taking the fluctuation of energies of pulsed laser light into consideration. The time $T_0$ when the wafer 19 is moved by the width D in the X direction is expressed by use of the scan speed V of the wafer 19 in the X direction as follows:

$$T_0 = D/V. \tag{1}$$

Accordingly, the oscillation frequency of the light source 2 is $m/T_0$ (=m.V/D). When a certain exposure point 34a on the wafer 19 traverse the exposure area 33 with the width D, exposure energies of laser light corresponding to m pulses are given to the exposure point 34a. That is, the oscillation cycle of emitting pulsed laser light is set such that pulsed laser light is emitted every time the wafer 19 is scanned by a predetermined distance. In an exposure by the slit scan exposure method, exposure energies corresponding to the minimum number $N_{min}$ of pulses (or more) are given to any exposure point on the wafer 19, whereby the uniformity of luminous intensity becomes preferable.

Figure 2C:
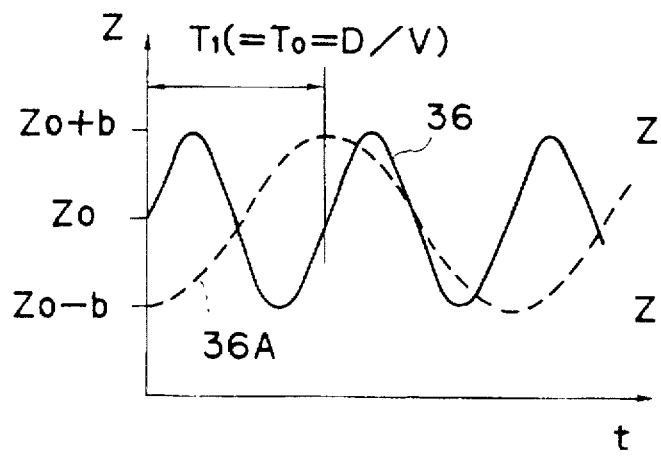
FIG. 2C shows the change of the focus position of the exposure surface of the wafer.

Further, when scanning the shot area 34 of the wafer 19 with respect to the exposure area 33, the main control system 16 of FIG. 1 oscillates the exposure surface of the wafer 19 periodically in the Z direction with respect to the image plane of the projection optical system 18 by operating the Z stage 20. A curve 36 of FIG. 2C shows the change of the position (focus position Z) of the exposure surface of the wafer 19 in the Z direction at that time by the time t. In FIG. 2C, the position $Z_0$ represents the position of the image plane of the projection optical system 18. As indicated by the curve 36, the focus position Z of the exposure surface of the wafer 19 is changed in a cycle $T_1$ like a sine wave between the position ($Z_0$+b) and the position ($Z_0$−b). The oscillation width 2b which is the width of deviations from the image plane $Z_0$ in the focus direction is set in accordance with the depth of focus of the projection optical system 18 itself and the thickness of the photoresist on the wafer 19. The initial position of the wafer 19 in the focus direction, i.e., the focus position Z from which the wafer 19 is started to be oscillated in the focus direction may be any position between the position ($Z_0$+b) and the position ($Z_0$−b). Its cycle $T_1$ is set to be equivalent to the time $T_0$ when any point of the wafer 19 traverses the width D of the exposure area 33 in the X direction.

Figure 3:
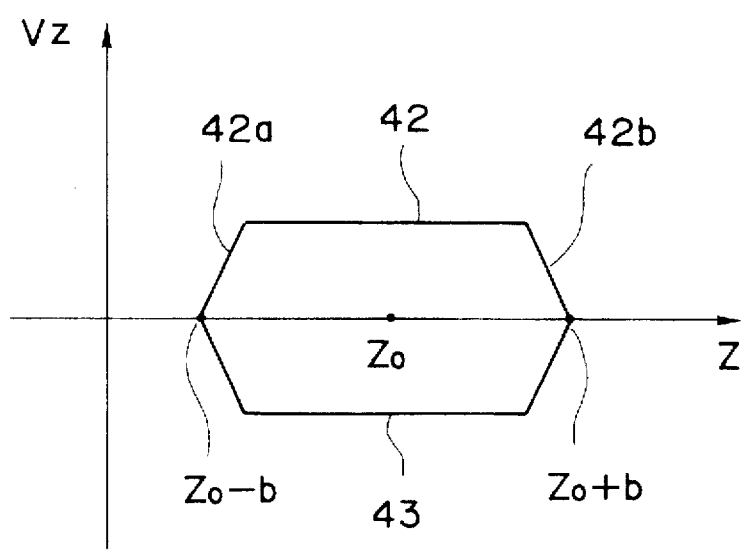
FIG. 3 shows an example of the velocity of the Z stage in the Z direction.

FIG. 3 shows the method of controlling the velocity $V_z$ of the Z stage 20 in the focus direction (Z direction) when exposures are performed by the slit scan exposure method. When the focus position Z is changed from the position ($Z_0$−b) to the position ($Z_0$+b), the velocity $V_z$ of the Z stage 20 is changed like a trapezoid as indicated by a bent line 42. That is, the velocity $V_z$ is gradually increased from 0 as indicated by an arrow along an inclined portion 42a thereby to cause the focus position Z to be moved upward from the position ($Z_0$−b). And, when the focus position Z approaches the position ($Z_0$+b), the velocity $V_z$ becomes gradually 0 as indicated by an arrow along an inclined portion 42b. Between the inclined portions 42a and 42b the velocity is constant as the focus postion Z is moved upward. When the focus position Z is changed from the position ($Z_0$+b) to the position ($Z_0$−b), the velocity $V_z$ of the Z stage 20 is changed like a trapezoid as indicated by a bent line 43 having reverse direction with respect to the bent line 42. That is, the velocity in a downward direction is increased from zero, then is constant as the focus position Z moves downwardly from the position ($Z_0$+b) and then becomes gradually 0 when the focus position Z approaches the position ($Z_0$−b). Consequently, in this embodiment, although the pulse oscillation of the light source 2 is performed in synchronism with the scanning of the wafer 19 and the reticle 11, it is sufficient to effect the speed control with the velocity characteristics as shown in FIG. 3 so as to control the movement of the Z stage 20 in the Z direction.

In this embodiment, if the cycle of oscillating the exposure surface of the wafer 19 in the focus direction is $T_n$ (n is an integer equal to or more than 1), the cycle $T_n$ is set to be $1/n$ of the time $T_0$ when any point on the wafer 19 traverses the exposure area 33 with the width D in the X direction. That is, the cycle $T_n$ is expressed by the scan speed V of the wafer 19 and the width D of the exposure area 33 as follows. The cycle $T_n$ may be twice the time $T_0$ (to be described later).

$$T_n = T0/n = D/(n.V). \tag{2}$$

FIG. 2C shows the case where the oscillation cycle $T_1$ is equivalent to the time $T_0$ (n =1). When n is 1, the focus position of the exposure point 34a in the shot area 34 on the wafer 19 is oscillated one time between the position ($Z_0$+b) and the position ($Z_0$−b) while the exposure point 34a traverses the width D of the exposure area 33 in the X direction. While the exposure point 34a traverses the exposure area 33, the light source 2 of the FIG. 1 emits m pulsed laser beams in constant cycles and the same portion of the pattern of the reticle 11 of FIG. 1 is repeatedly exposed on the exposure point 34a. As a result, in the exposure point 34a, the distribution of the exposure energies E (Z) with respect to the focus position Z comes to be expressed by a distribution curve 37 of FIG. 2D. The exposure energies at the position ($Z_0$+b) and the position ($Z_0$−b) become large.

Similarly, when any exposure point in the shot area 34 on the wafer 19 traverses the width D of the exposure area 33 in the X direction, its focus position is oscillated one time between the position ($Z_0$+b) and the position ($Z_0$−b). Accordingly, in the distribution of the exposure energies of any exposure point, the exposure energies at the positions ($Z_0$+b) and ($Z_0$−b) become large, whereby the depth of focus of the projection optical system 18 is increased substantially. Therefore, when enlarging the numerical aperture of the projection optical system 18 so as to improve resolution and performing exposures by the slit scan exposure method, the pattern of the reticle 11 can be exposed on the entire exposure surface of the wafer 19 with high resolution even though there are irregularities on the exposure surface of the wafer 19. Also, the exposures are effected by one scanning so as to increase the depth of focus, so that the throughput will not be lowered. In this case, when exposing an isolated pattern such as a contact hole, the effect of the increase of the depth of focus is increased.

Although not satisfying the condition of the equation (2), the exposure surface of the wafer 19 may be oscillated with respect to the image plane of the projection optical system 18 in a cycle of twice the time $T_0$ when any point on the wafer 19 traverses the width D of the exposure area 33 in the X direction, as indicated by a broken curve 36A in FIG. 2C. Also, in this case, while any exposure point in the shot area on the wafer 19 traverses the width D of the exposure area 33 in the X direction, its focus position is shifted between the position $(Z_0+b)$ and the position $(Z_0-b)$. As a result, the depth of focus is increased.

Figure 2D:
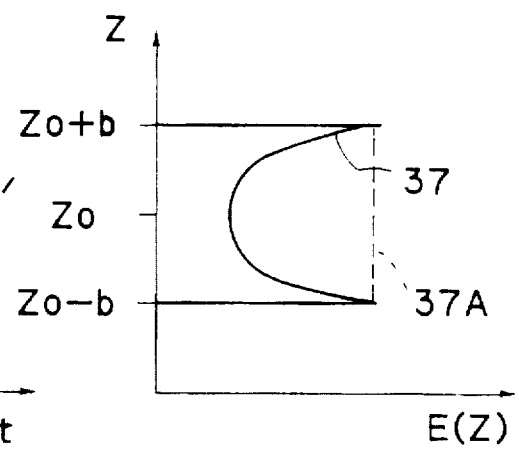
FIG. 2D shows a relationship between the focus position of the exposure surface of the wafer and exposure energies.

Further, exposure energies E (Z) with respect to the focus position Z may be approximately uniform values (flat distribution) between the position $(Z_0-b)$ and the position $(Z_0+b)$, as indicated by a curve 37A in FIG. 2D.

Figure 4A:
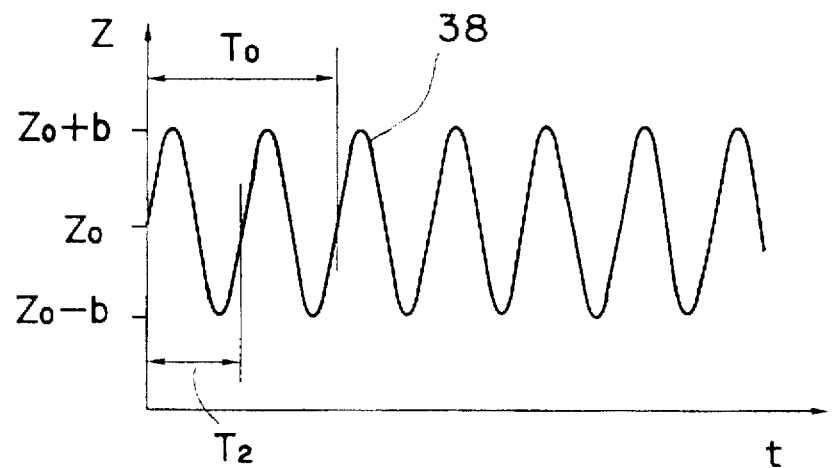
FIGS. 4A, 4B and 4C show other examples of the change of the focus position of the exposure surface of the wafer.

As an other example satisfying the condition of the equation (2), when the exposure surface of the wafer 19 is oscillated with respect to the image plane of the projection optical system 18 in a cycle of half the time $T_0$ when any point on the wafer 19 traverses the width D of the exposure area 33 in the X direction, the focus position Z of the exposure surface of the wafer 19 is changed as a curve 38 in FIG. 4A. In this case, while any exposure point in the shot area on the wafer 19 traverses the width D of the exposure area 33 in the X direction, the focus position is oscillated two times between the position $(Z_0+b)$ and the position $(Z_0-b)$. As a result, the distribution of the exposure energies of any exposure point becomes as shown in FIG. 2D, whereby the effect of the increase of the depth of focus can be obtained.

Figure 4B:
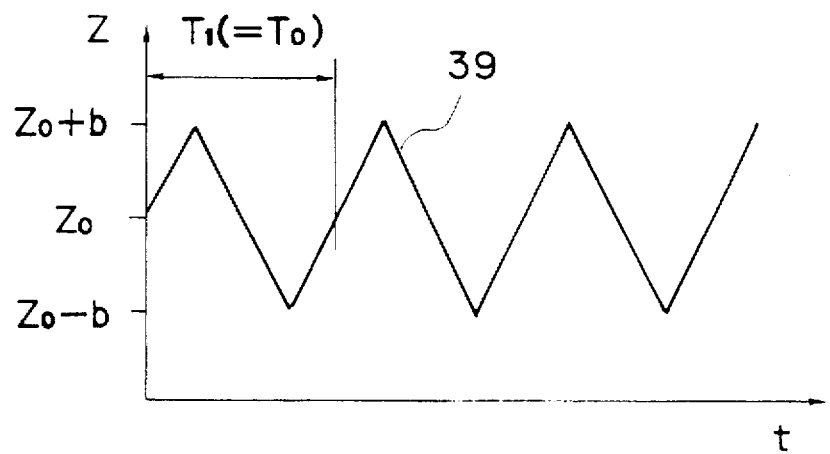

The exposure surface of the wafer 19 is oscillated with respect to the image plane of the projection optical system 18 like the sine wave in the above embodiment, but may be oscillated like a triangular wave. When the exposure surface of the wafer 19 is oscillated with respect to the image plane of the projection optical system 18 in the Z direction like the triangular wave at the cycle $T_1$ equivalent to the time $T_0$ when any point on the wafer 19 traverses the width D of the exposure area 33 in the X direction, the focus position Z of the exposure surface of the wafer 19 is changed as a zigzag line 39 in FIG. 4B. Also, in this case, the distribution of the exposure energies of any exposure point on the wafer 19 becomes close to the distribution shown in FIG. 2D, whereby the effect of the increase of the depth of focus can be obtained.

Further, although in the above-described embodiment, the exposure surface of the wafer 19 is oscillated continuously in the Z direction when performing exposures by the slit scan exposure method, it may be oscillated in the Z direction in a step-like manner or an intermittent manner.

Figure 4C:
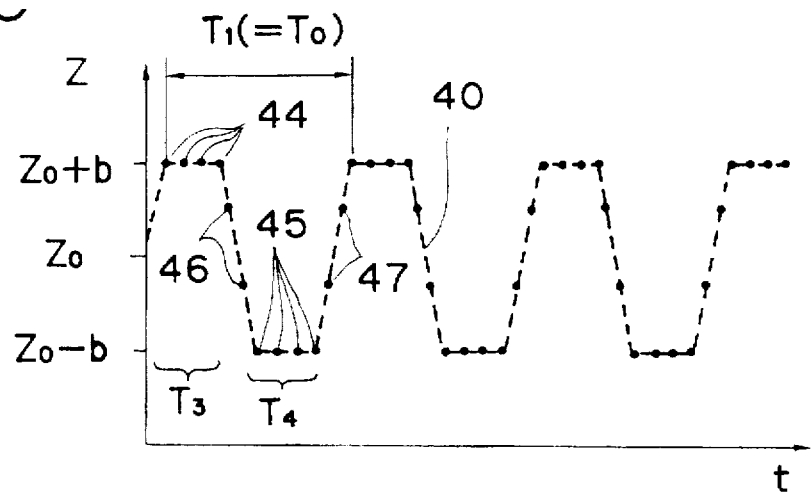

A zigzag line in FIG. 4C indicates the change of the focus position Z of the exposure surface of the wafer 19 when the exposure surface of the wafer 19 is oscillated in the Z direction in the step-like manner or the intermittent manner. At this time, the focus position Z is shifted between the position $(Z_0+b)$ and the position $(Z_0-b)$ in the cycle $T_1$. The cycle $T_1$ is equal to the time $T_0$ when any exposure point traverses the width D of the exposure area 33 in the X direction.

Also, as the light source of this embodiment is the pulse oscillation type, pulsed laser light is emitted at points 44 marked with black dots in a period $T_3$ during which the focus position of the exposure surface of the wafer 19 is the position $(Z_0+b)$ and at points 45 marked with black dots in a period $T_4$ during which the focus position is the position $(Z_0-b)$. Also, pulsed laser light is emitted at corresponding points where the period $T_3$ and the period $T_4$ are each displaced by the cycle $T_1$. By this exposure method, in any exposure point on the wafer 19, the distribution of exposure energies with respect to the focus position Z is approximately the same as the conventional distribution, whereby the effect of the increase of the depth of focus can be obtained. In FIG. 4C, even if pulsed laser light is emitted at points 46 and 47 where the focus position Z is changed between the position $(Z_0+b)$ and the position $(Z_0-b)$, a sufficient effect of the increase of the depth of focus can be substantially obtained.

Although a pulsed light source is used as the light source for emitting exposure light in the above embodiment, the present invention is applicable to a light source for effecting a continuous light emission such as a mercury lamp. In this case, also, the effect of the increase of the depth of focus can be obtained by shifting the exposure surface of the wafer and the image forming surface of the projection optical system relatively and periodically in the direction of the optical axis.

Further, instead of moving the wafer 19 in the focus direction, the reticle 11 may be moved in the Z direction or a predetermined lens in the projection optical system 18 may be moved in the axis direction thereof so as to move the image plane of the projection optical system 18 in the focus direction with respect to the wafer 19, whereby the effect of the increase of the depth of focus can be obtained similarly.

The present invention is not limited to the above-described embodiments and various modification can be made, without departing from the scope of the present invention.

What is claimed is:

1. A projection exposure apparatus comprising:
   an illumination optical system for illuminating an illumination area on a mask having a pattern to be transferred, with exposure light, said illumination area having a predetermined shape;
   a projection optical system for projecting an image of said pattern within said illumination area of said mask to a photosensitive substrate;
   a mask stage for scanning said mask in a predetermined scan direction with respect to said illumination area;
   a substrate stage for scanning said photosensitive substrate in a direction corresponding to said scan direction in synchronism with the scanning of said mask;
   a changing device for changing relative position of an image plane of said projection optical system and an exposure surface of said photosensitive substrate in a direction of an optical axis of said projection optical system; and
   a control system which controls said changing device to change said relative position in a cycle which is determined in accordance with a width of said illumination area in said corresponding direction and a velocity of scanning of said photosensitive substrate while the pattern on said mask is exposed onto said photosensitive substrate by said scanning.

2. An apparatus according to claim 1, wherein said control system controls said changing device to change said relative position in a cycle twice as great or 1/n times as great (n is an integer equal to or more than 1) as the time when said substrate stage is moved in said corresponding direction by a distance equivalent to a width of an area on said photosensitive substrate in said corresponding direction, said area on said photosensitive substrate corresponding to said illumination area.

3. A projection exposure method, comprising the steps of:

positioning a mask having a pattern to be transferred on a mask stage;

illuminating an illumination area on said mask with exposure light, said illumination area having a predetermined shape;

projecting an image of said pattern within said illumination area of said mask to a photosensitive substrate set on a substrate stage, via a projection optical system;

scanning said mask in a predetermined scan direction with respect to said illumination area;

scanning said photosensitive substrate in a direction corresponding to said scan direction in synchronism with the scanning of said mask; and changing relative position of an image plane of said projection optical system and an exposure surface of said photosensitive substrate in a direction of an optical axis of said projection optical system, in a predetermined cycle determined in accordance with a width of said illumination area in said corresponding direction and a velocity of said scanning of said photosensitive substrate while the pattern on said mask is exposed onto said photosensitive substrate by said scanning.

4. A method according to claim 3, wherein said changing step changes said relative position in a cycle twice as great or 1/n times as great (n is an integer equal to or more than 1) as the time when said substrate stage is moved by a distance equivalent to a width of an area on said photosensitive substrate in said corresponding direction, said area on said photosensitive substrate corresponding to said illumination area.

5. A scanning exposure method comprising:

moving a mask and a substrate synchronously so that said substrate is scanningly exposed to an image of a pattern of said mask; and changing, during scanning exposure, positional relationship between a plane on which an image of said pattern of the mask is formed and said substrate at a predetermined cycle in a manner interrelated with said synchronous movement.

6. A scanning exposure method according to claim 5, wherein light used for said exposure is pulsed light and a point on said substrate is irradiated with a number m (m being an integer) of light pulses while said point passes through an irradiation area of the pulsed light.

7. A scanning exposure method according to claim 6, wherein said number m is a number with which each point of said substrate is irradiated with pulsed light and is determined taking a variation in energy of pulsed light into account.

8. A scanning exposure method according to claim 6, wherein positional relationship between the plane on which said image of said pattern of the mask is formed and said substrate is changed at a cycle twice or 1/n (n being a positive integer) times the time required for radiating m light pulses onto said substrate.

9. A scanning exposure method according to claim 5, wherein light used for said exposure is pulsed light, and a width in a scanning direction, of pulsed light incident on said substrate, scanning speed of said substrate and an oscillation cycle of said pulsed light are determined such that a point on said substrate is irradiated with a number m (m being an integer) of light pulses while said point passes through an irradiation area of the pulsed light.

10. A scanning exposure method according to claim 5, wherein amount of change in positional relationship between said plane on which said image of said pattern of the mask is formed and said substrate is determined based on at least one of a depth of focus of a projecting optical system for projecting said image of the pattern of the mask onto said substrate and a thickness of a resist layer applied on said substrate.

11. A scanning exposure method according to claim 5, wherein positional relationship between the plane on which said image of said pattern of the mask is formed and said substrate is changed at a cycle determined in accordance with a width in a scanning direction, of pulsed light incident on said substrate and scanning speed of said substrate.

12. A scanning exposure method according to claim 5, wherein light used for said exposure is pulsed light and positional relationship between the plane on which said image of said pattern of the mask is formed and said substrate is changed at a cycle determined in accordance with an oscillation cycle of said pulsed light.

13. A scanning exposure method according to claim 5, wherein positional relationship between the plane on which said image of said pattern of the mask is formed and said substrate is changed at a cycle twice or 1/n (n being a positive integer) times the time required for said substrate to move by a distance equal to a width in a scanning direction, of pulsed light incident on said substrate.

14. A scanning exposure method according to claim 5, wherein positional relationship between the plane on which said image of said pattern of the mask is formed and said substrate is changed continuously or stepwise.

15. A scanning exposure method according to claim 5, wherein positional relationship between the plane on which said image of said pattern of the mask is formed and said substrate is changed by moving a part of lens elements of a projection optical system for projecting said image of said pattern of the mask onto said substrate.

16. A scanning exposure method according to claim 5, wherein positional relationship between the plane on which said image of said pattern of the mask is formed and said substrate is changed by moving said mask.

17. A scanning exposure method according to claim 7, wherein positional relationship between the plane on which said image of said pattern of the mask is formed and said substrate is changed by changing a wavelength of said pulsed light.

18. A scanning exposure method comprising:

emitting exposure light;

moving a mask and a substrate synchronously so that said substrate is scanningly exposed to an image of a pattern of said mask, by said exposure light; and changing, during a scanning exposure, positional relationship between a plane on which said image of said pattern of the mask is formed and said substrate from a predetermined relationship and returning to the predetermined relationship while a point on said substrate passes through an irradiation area of said exposure light.

19. A scanning exposure method comprising:

moving a mask and a substrate synchronously so that said substrate is scanningly exposed to an image of a pattern of said mask;

emitting, during a scanning exposure, pulsed light at a predetermined cycle so that each point on said substrate is irradiated with an integer number of light pulses; and changing, during said scanning exposure, relative positions of a plane on which said image of said pattern of the mask is formed and said substrate in accordance with a cycle at which said pulsed light is emitted.

20. A scanning exposure method comprising:

emitting pulsed light at a predetermined cycle;

moving a mask and a substrate synchronously such that said substrate moves by a distance equal to a width in a moving direction, of pulsed light incident on said substrate while m (m being an integer) light pulses are emitted; and changing positional relationship between a plane on which an image of a pattern of the mask is formed by the pulsed light and said substrate in accordance with the predetermined cycle of said pulsed light.

* * * * *